( 12 ) United States Patent
Khaselev et al.

(10) Patent No.: US 8,252,417 B2
(45) Date of Patent: Aug. 28, 2012

(54) METALLIC PARTICLES FOR ELECTROKINETIC OR ELECTROSTATIC DEPOSITION

(75) Inventors: Oscar Khaselev, Monmouth Junction, NJ (US); Brian G. Lewis, Branford, CT (US)

(73) Assignee: Fry's Metals, Inc., South Plainfield, NJ (US)

( * ) Notice: Subject to any disclaimer, the term of this patent is extended or adjusted under 35 U.S.C. 154(b) by 963 days.

(21) Appl. No.: 12/191,691

(22) Filed: Aug. 14, 2008

(65) Prior Publication Data

US 2008/0296540 A1 Dec. 4, 2008

Related U.S. Application Data

(62) Division of application No. 11/065,764, filed on Feb. 25, 2005, now Pat. No. 7,413,805.

(51) Int. Cl.
*B32B 15/04* (2006.01)
*B32B 5/16* (2006.01)
*H01B 1/22* (2006.01)

(52) U.S. Cl. .......... 428/403; 252/500; 252/512; 148/23; 75/253; 430/119.5; 430/115

(58) Field of Classification Search .................. 428/323, 428/402, 403; 252/500, 506, 512–514; 427/96.1, 427/98.4, 214, 215, 216, 220, 383.1; 430/117, 430/119; 148/23, 24, 430, 433
See application file for complete search history.

(56) References Cited

U.S. PATENT DOCUMENTS

| | | | |
|---|---|---|---|
| 3,900,412 A | 8/1975 | Kosel | |
| 4,289,534 A | 9/1981 | Deffeyes et al. | |
| 4,297,502 A | 10/1981 | Herrmann et al. | |
| 4,298,407 A | 11/1981 | Taylor | |
| 4,318,747 A | 3/1982 | Ishijima et al. | |
| 4,619,715 A | 10/1986 | Hwang | |
| 4,643,995 A | 2/1987 | Engel et al. | |
| 4,719,164 A | 1/1988 | Podszun et al. | |
| 4,859,241 A * | 8/1989 | Grundy ........................ | 106/1.14 |
| 5,110,384 A | 5/1992 | Dudek et al. | |
| 5,300,390 A | 4/1994 | Landa et al. | |
| 5,376,403 A | 12/1994 | Capote et al. | |
| 5,502,118 A | 3/1996 | Macholdt et al. | |
| 5,571,455 A | 11/1996 | Higuchi | |
| 5,817,374 A | 10/1998 | Detig et al. | |
| 5,861,530 A | 1/1999 | Atkins et al. | |
| 5,922,403 A | 7/1999 | Tecle | |
| 5,976,337 A | 11/1999 | Korinko et al. | |

(Continued)

FOREIGN PATENT DOCUMENTS

WO 00/76699 * 12/2000

(Continued)

OTHER PUBLICATIONS

Data on carboxylic acids, Hawley's Condensed Chemical Dictionary, 14th Edition, 2002, pp. 1-3.

(Continued)

*Primary Examiner* — Stanley Silverman
*Assistant Examiner* — Kallambella Vijayakumar
(74) *Attorney, Agent, or Firm* — Senniger Powers LLP

(57) ABSTRACT

Metallic particles for electrokinetic or electrostatic deposition, and a method for making such particles, comprising metallic particle bodies, an organic acid film on the particle bodies, and a charge director adhered to the organic acid film.

18 Claims, 1 Drawing Sheet

U.S. PATENT DOCUMENTS

| | | | |
|---|---|---|---|
| 5,981,043 A | 11/1999 | Murakami et al. | |
| 6,025,258 A | 2/2000 | Ochiai et al. | |
| 6,153,348 A * | 11/2000 | Kydd et al. | 430/117.4 |
| 6,156,237 A | 12/2000 | Kubota et al. | |
| 6,157,789 A | 12/2000 | Kamada et al. | |
| 6,262,833 B1 | 7/2001 | Loxley et al. | |
| 6,274,412 B1 * | 8/2001 | Kydd et al. | 438/149 |
| 6,337,028 B1 | 1/2002 | Masuko et al. | |
| 6,345,718 B1 | 2/2002 | Minogue | |
| 6,511,713 B2 | 1/2003 | Mathisen et al. | |
| 6,524,758 B2 | 2/2003 | Eberlein et al. | |
| 6,579,652 B1 | 6/2003 | Detig et al. | |
| 6,730,400 B1 * | 5/2004 | Komatsu et al. | 428/403 |
| 6,764,801 B2 | 7/2004 | Meyer | |
| 6,781,612 B1 | 8/2004 | Detig | |
| 6,815,130 B2 | 11/2004 | Eberlein et al. | |
| 6,876,370 B2 | 4/2005 | Detig | |
| 7,157,193 B2 | 1/2007 | Kawamura et al. | |
| 7,413,771 B2 | 8/2008 | Arora et al. | |
| 2005/0019360 A1 | 1/2005 | Ballinger et al. | |
| 2005/0100735 A1 * | 5/2005 | Arora et al. | 428/403 |
| 2005/0100810 A1 | 5/2005 | Detig | |

FOREIGN PATENT DOCUMENTS

| | | |
|---|---|---|
| WO | 02/48980 A1 | 6/2002 |
| WO | 02/063397 A1 | 8/2002 |
| WO | 02/071465 A1 | 9/2002 |
| WO | 2005007919 A2 | 1/2005 |
| WO | WO 2005/007919 A2 * | 1/2005 |

OTHER PUBLICATIONS

Acetic Acid, Section-8, Handbook of Organic Solvent Properties, 1996, Elsiever pp. 1-5.

International Search Report, PCT/US06/06632, dated Aug. 11, 2006, 1 page.

Written Opinion of the International Searching Authority, PCT/US06/06632, dated Aug. 11, 2006, 3 pages.

* cited by examiner

METALLIC PARTICLES FOR ELECTROKINETIC OR ELECTROSTATIC DEPOSITION

CROSS REFERENCE TO RELATED APPLICATION

This application is a divisional of U.S. non-provisional application Ser. No. 11/065,764, filed Feb. 25, 2005, now U.S. Pat. No. 7,413,805, issued Aug. 19, 2008, the entire disclosure of which is incorporated herein by reference.

FIELD OF THE INVENTION

The present invention relates to a method for preparing metallic particles for the electrokinetic or electrostatic deposition, such as for solder metal particles for electrokinetic or electrostatic deposition in manufacturing electronic devices.

BACKGROUND OF THE INVENTION

In a variety of applications, it is desirable to apply organic or inorganic particles, such as metal particles and metal powders, to substrates in a predetermined pattern. One such application is in the formation of patterns of solder metal or metal alloy particles to form solderable surfaces and structures on electronic parts and components.

The solder metal or metal alloy particles are suspended in a highly concentrated bath, or toner. Typical toners for electrokinetic deposition of tin powder, for example, consist of solvent (such as ISOPAR), charge director (such as polylecithin), and metal particles.

In electrokinetic or electrostatic deposition, the powder particles possess an electrical charge. To impart the charge, the surfaces of metal particles are pretreated by coating with an acidic polymer. Such a polymer will react with the charge director in the toner and create electrical charge on the surface of the particle necessary for electrokinetic or electrostatic deposition.

According to the conventional method of preparing the solder metal particles, the electrical charge is imparted to the powder, or to particles or spheres that are used, to make it electrokinetic by coating it with a charge control material. This involves, for example, coating the powder with a dielectric polymer material in solvent such as Joncryl 682 available from Johnson Polymer of Sturdevant, Wis. dissolved in IPA. Coating occurs in a fluidized bed coater. The purpose of the dielectric polymer is to provide a very acidic or hydroxyl surface with which the subsequently applied charge director can chemically react. The coated powder is subsequently wetted with a liquid having suitable dielectric properties, such as Isopar-G available from Exxon Mobil. Another suitable liquid is a product available from 3-M Corporation under the trade name Fluorinert. The powder constitutes about 0.5 to about 50 wt. % of the powder/liquid mixture, and about 1 to about 20 vol. % of the powder/liquid mixture. The powder is then dried and sieved to remove clumps and achieve a uniform powder size. The powder is then added to a charge control material such as poly lecithin electrolyte in an amount between about 10 and 20,000 microliters charge control material per liter Isopar.

Such a method has two distinct shortcomings: (1) the method of preparation is laborious and requires special equipment, and (2) polymer coated toner powders exhibit poor reflow characteristics. The method of preparation of the conventional toner requires coating on a fluidized bed coater, a specialized and expensive piece of equipment. The polymer coated toner must also be sieved because the toner powder clumps in conventional toners. This additional process step lowers the amount of usable product. Moreover, the polymer coating interferes with the reflow process which usually follows the deposition. Since the polymer is not completely soluble in the flux, the polymer leaves a solid residue on the reflow surface. This is problematic because the residues impede the electrical conductivity of the joint and can form a coating between the solder and the soldered electronic part, thus lessening the strength of the soldered joint.

Therefore, a need exists for a simpler method for preparing an electrokinetic or electrostatic deposition toner that eliminates the need for the special equipment and laborious process involved in the preparation of conventional toners. Further, there exists a need for a toner for imparting a charge on the surface of the tin particles that uses a film which does not interfere with the reflow process.

SUMMARY OF THE INVENTION

It is an object of this invention to provide organic or inorganic particles prepared by a simple method which renders the particles amenable to treatment with a charge director, so that the particles can thereby be rendered electrokinetically or electrostatically mobile.

It is a further object of this invention to provide electrokinetically mobile particles that are particularly suitable for use in an electrokinetic or electrostatic deposition toner.

It is a further object of this invention to provide a toner that is suitable as a solder metal or metal alloy deposition toner which possesses good reflow properties.

Briefly, therefore, the invention is directed to a method for preparing metallic particles for electrokinetic or electrostatic deposition comprising the steps of contacting the metallic particles with an organic acid to form an organic acid surface film on the particles; and contacting the particles with a charge director medium which adheres to the organic acid surface film to impart an electrical charge to the particles.

In another aspect the invention is directed to a method for preparing solder metal particles for electrokinetic or electrostatic deposition comprising the steps of contacting the Sn-based solder metal particles with an organic acid selected from the group consisting of acetic acid, dicholoroacetic acid, trichloroacetic acid, propionic acid, maleic acid, glutaric acid, and methacryclic acid in a ratio of weight of organic acid to weight of metallic particles in a range between about 0.2:1 to about 2:1 to form an organic acid surface film on the particles; and contacting the particles with a charge director medium which adheres to the organic acid surface film to impart an electrical charge to the particles, wherein the charge director medium is a solution comprising a charge director selected from the group consisting of barium petronate, calcium petronate, copper napthenate, and aluminum stearate.

The invention is also directed to metallic particles for electrokinetic or electrostatic deposition comprising metallic particle bodies; an organic acid film on the particle bodies; and a charge director adhered to the organic acid film.

Other objects and features will be in part apparent and in part pointed out hereinafter.

DETAILED DESCRIPTION OF THE EMBODIMENT(S) OF THE INVENTION

Figure 1:
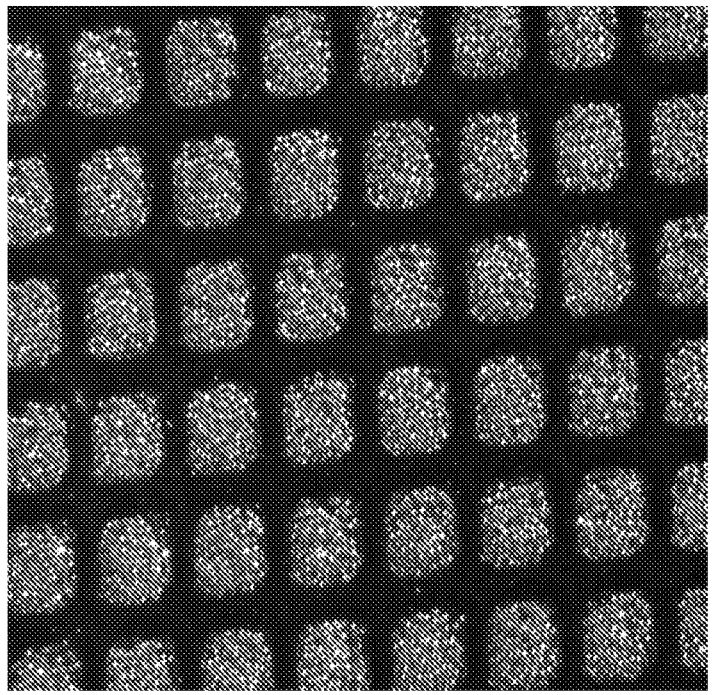
FIG. 1 is an optical photograph of solder powder (Sn—Ag—Cu alloy) deposited from the toner of the present invention after patterning.

In accordance with the invention, a toner is prepared for electrokinetic and electrostatic deposition of metal and metal alloy particles, for example for deposition of tin and tin alloy powders to form solderable structures on electronic parts and components.

The present invention stems from the discovery that organic acids, such as acetic acid, impart two distinct advantages when employed in forming thin molecular films on the surface of tin and tin alloy particles. First, the method of toner preparation is greatly simplified because there is no need for a fluidized bed coater or sieving the dry powder. Second, a toner with particles having thin molecular films exhibits good reflow characteristics. For example, an organic acid thin molecular film leaves no solid residues on the reflow surface, and thus, the surface is bright. Moreover, solder joints employing the toner of the present invention exhibit good electrical conductivity and better strength.

Organic acids suitable for the toner of the present invention should be liquid at room temperature or slightly elevated temperatures and also be strong acids. Examples of suitable organic acids are acetic acid, di- or tricholoroacetic acid, propionic, maleic, glutaric, and methacryclic acids.

Once the thin highly acidic molecular film is formed on the surface of the tin particles, either by reaction or adsorption of the organic acid on the surface of the tin particles, the particles are mixed with a charge director medium to form the toner. The thin molecular film reacts with the charge director, which imparts a positive or negative charge upon the tin particles, thereby rendering the particles electrokinetically mobile and suitable for electrokinetic and electrostatic deposition.

In one embodiment of this invention, the particles are Sn-based material, such as a powder or particle bodies selected from among Sn and alloys of Sn/Pb, Sn/Ag/Cu, Sn/Ag, Cu, Sn/Ag/Bi, Sn/Bi, Sn/Pb/Bi, or others.

The particle size is typically between about 0.5 microns and 1 mm. In one embodiment, the particles are powder particles having an average diameter between about 0.5 and about 50 microns. In another embodiment, they are powder particles having an average diameter between about 1 and about 100 microns. In applications that require better resolution, the particles are typically about 5 microns. One preferred powder is a Type 6 powder with a size distribution primarily between about 10 and about 20 microns. The particles are alternatively mid-sized particles having an average particle size between about 50 and about 500 microns. In a further alternative, they are relatively larger spheres of inorganic material having an average size greater than about 100 microns, such as between 100 microns and 1 mm. These are, for example, solder metal spheres. For certain applications, organometallic particles may be used. The particles are therefore metallic in that they can be 100% metal or organometallic.

In one embodiment, tin particles are mixed with fully concentrated organic acid in an amount of acid sufficient to physically wash the tin particles, wet the outer surfaces the tin particles with acid, and form thin molecular films around the tin particles. The ratio of the mass of tin particles and the mass of acid sufficient to wet the tin particles may range from about 0.2 to about 2. A preferred organic acid is acetic acid. However, the organic acid may be selected from among di- or tricholoroacetic acid, propionic, maleic, glutaric, and methacryclic acids. These acids are chosen because they are liquid at room temperature or slightly above room temperature, strong acids, highly reactive with the powder metal surface, and highly reactive with the charge director in the toner.

In one embodiment, a mixture of approximately equal parts of about 60 g of tin particles and about 60 g of glacial acetic acid are mechanically agitated to allow the surface of the tin particles to react with the acid. Without being bound to a particular theory, it is thought that the acetic acid reacts with the tin surface to coat the tin particles with a thin molecular film of tin acetate and adsorbed acetic acid. This film provides a surface characterized as a very acidic surface with which a subsequently applied charge director can react.

After agitation, excess, unreacted acetic acid is decanted. The acetic acid may be used multiple times to wash and react with multiple batches of tin powders.

The tin particles are washed at least once. In one embodiment the particles are washed between two and five times, first in IPA (isopropyl alcohol) and then with a neutral high dielectric organic liquid such as isoparaffin distributed by Exxon Chemical of Houston, Tex. under the trade name ISOPAR. This process yields prepared solder particles ready for use in patterning, or the solder particles may be stored without loss of stability for up to 3 months.

In accordance with the invention, a charge directing medium including a charge director is prepared. The charge director may be chosen from among barium petronate, calcium petronate, copper napthenate, aluminum stearate, and many other charge directors, provided they can accept protons and impart a negative charge on the prepared solder particles of the present invention. The charge director is added directly to the toner.

In one embodiment, barium petronate modified by perfusion with distilled water is employed as the charge director. It has been discovered that barium petronate has an advantage that it allows the deposition to be self-limiting, and therefore more controllable. In particular, most charge directors such as poly lecithin detach from the particles and dissipate into the solution after the particles are deposited on the substrate. Barium petronate, in contrast, remains on the particles. As such, the barium petronate charge on deposited particles balances out the electrostatic or electrokinetic deposition driving forces locally at the substrate. As deposition advances, the driving force is eventually balanced by the deposited charge. In this way the deposition can be controlled by controlling the quantity of barium petronate charge director mixed into the solution; or the voltage (or charge level) of the imaging tool.

To use the particles in an electrostatic or electrokinetic process, a toner is prepared in which the prepared solder particles, such as tin particles with a thin highly acidic molecular film, are mixed with a charge directing medium, such as a barium petronate solution. By contacting the prepared solder particles with the charge directing medium, the charge director material imparts a positive or negative charge and thereby renders the particle bodies electrostatically or electrokinetically mobile.

The following examples further illustrate the invention.

EXAMPLE 1

For preparation of a charge director, barium petronate (10 g) available from Crompton Corporation of Middlebury, Conn. (USA) was added to Isopar G (90 g) available from ExxonMobil Chemical Company of Houston, Tex. (USA) in a 200 ml beaker. The beaker was placed on a heated stir plate and heated/stirred until it reached a temperature of 80-90° C.

Highly polished water (10 g), i.e., very pure distilled water was added one drop (~16 micro-liter) at a time while the solution was continually stirred and heated. After all the water was added the solution was stirred and heated for a further one hour. The heat was then removed and stirring was continued until the solution has cooled. A tan-colored precipitate was noted to form. The mixture was aged for one day at room temperature, then filtered and the precipitate discarded.

EXAMPLE 2

For solder powder coating, tin or tin alloy powder was mixed with glacial acetic acid in approximately equal weight parts. 60 g of tin or tin alloy powder was mixed with about 60 g of glacial acetic acid. The mixture was mechanically agitated for about 20 minutes in a mixer. The mechanical agitation was then stopped, and the excess, unreacted acetic acid was decanted. The tin powder was washed in IPA twice and further washed in ISOPAR twice to yield the tin powder suitable for toner according to the present invention.

EXAMPLE 3

For toner preparation, 60 g of coated powder prepared according to Example 2 was added to 1 liter of Isopar G in a 1.4 liter beaker and stirred with an appropriate mixer, such as "The Agitator" available from Victory Engineering, Hillside, N.J. (USA). Charge director (0.5 mL) prepared according to Example 1 was added to the mixture and the stirring continued for at least four hours. The toner was allowed to age for two hours at room temperature. The toner was protected from a high humidity environment (>60% RH) to maintain stable performance.

EXAMPLE 4

Figure 2:
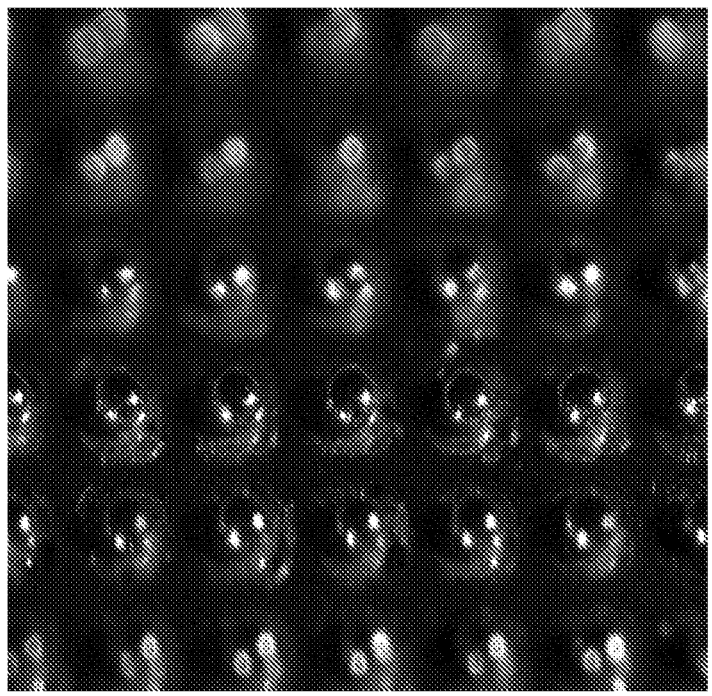
FIG. 2. is an optical photograph of solder powder (Sn—Ag—Cu alloy) deposited from the toner of the present invention after reflow.

The toner of Example 3 was used to form a pattern of charged solder powder on a substrate. FIG. 1 shows the pattern of solder powder (Sn—Ag—Cu alloy) deposited from the toner of the present invention. The soldered particles were reflowed. FIG. 2. shows the reflowed solder powder (Sn—Ag—Cu alloy) deposited from the toner of the present invention. The reflowed powder was bright and lacked the solid residues of conventional toner particles.

This process yielded a toner comprising electrokinetically mobile particles for use in an electrostatic or electrokinetic deposition process. The particles comprised the particle bodies, the thin molecular film on the particle bodies which facilitated attachment thereto of a charge director material, and the above-described charge director material on the thin molecular film wherein the charge director material had a negative charge and thereby rendered the particle bodies electrostatically or electrokinetically mobile.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The foregoing relates to a limited number of embodiments that have been provided for illustration purposes only. It is intended that the scope of invention is defined by the appended claims and there are modifications of the above embodiments that do not depart from the scope of the invention.

We claim:

1. Metallic particles for electrokinetic or electrostatic deposition comprising:
    metallic particle bodies;
    a molecular film on the particle bodies comprising an organic acid; and
    a charge director adhered to the organic acid film, wherein the charge director is selected from the group consisting of barium petronate, calcium petronate, copper napthenate, and aluminum stearate and the metallic particles have a positive or negative charge;
    wherein the molecular film on the particle bodies comprises acetic acid.

2. The metallic particles of claim 1 wherein the metallic particle bodies are solder metal particle bodies.

3. The metallic particles of claim 1 wherein the metallic particle bodies are selected from the group consisting of Sn particle bodies and Sn alloy particle bodies.

4. The metallic particles of claim 1 wherein the metallic particle bodies comprise a material selected from the group consisting of Sn, Sn/Pb, Sn/Ag/Cu, Sn/Ag, Sn/Cu, Sn/Ag/Bi, Sn/Bi, and Sn/Pb/Bi.

5. The metallic particles of claim 1 wherein the metallic particle bodies have a particle size between about 0.5 micron and about 50 microns.

6. The metallic particles of claim 1 wherein the metallic particle bodies have a particle size between about 1 micron and about 1000 microns.

7. The metallic particles of claim 1 wherein the metallic particle bodies have a particle size between about 50 microns and about 500 microns.

8. The metallic particles of claim 1 wherein the metallic particle bodies have a particle size between about 10 microns and about 20 microns.

9. The metallic particles of claim 1 wherein the metallic particle bodies have a particle size between about 100 microns and about 1 mm.

10. The metallic particles of claim 1 wherein the charge director is barium petronate or calcium petronate.

11. The metallic particles of claim 1 wherein the charge director is copper napthenate.

12. The metallic particles of claim 1 wherein the charge director is aluminum stearate.

13. Metallic particles for electrokinetic or electrostatic deposition comprising:
    metallic particle bodies;
    a molecular film on the particle bodies comprising dicholoroacetic acid; and
    a charge director adhered to the organic acid film.

14. The metallic particles of claim 13 wherein the charge director is selected from the group consisting of barium petronate, calcium petronate, copper napthenate, and aluminum stearate.

15. Metallic particles for electrokinetic or electrostatic deposition comprising:
    metallic particle bodies;
    a molecular film on the particle bodies comprising trichloroacetic acid; and
    a charge director adhered to the organic acid film.

16. The metallic particles of claim 15 wherein the charge director is selected from the group consisting of barium petronate, calcium petronate, copper napthenate, and aluminum stearate.

17. Metallic particles for electrokinetic or electrostatic deposition comprising:
  metallic particle bodies;
  a molecular film on the particle bodies comprising an organic acid; and
  a charge director adhered to the organic acid film, wherein the charge director is selected from the group consisting of barium petronate, calcium petronate, copper napthenate, and aluminum stearate and the metallic particles have a positive or negative charge;
  wherein the molecular film on the particle bodies comprises propionic acid.

18. Metallic particles for electrokinetic or electrostatic deposition comprising:
  metallic particle bodies;
  a molecular film on the particle bodies comprising an organic acid; and
  a charge director adhered to the organic acid film, wherein the charge director is selected from the group consisting of barium petronate, calcium petronate, copper napthenate, and aluminum stearate and the metallic particles have a positive or negative charge;
  wherein the molecular film on the particle bodies comprises methacryclic acid.

* * * * *